Figure 1:
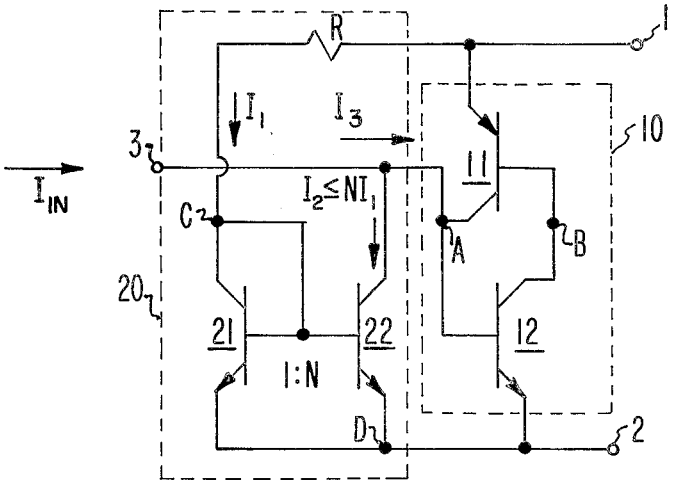
Figure 2:
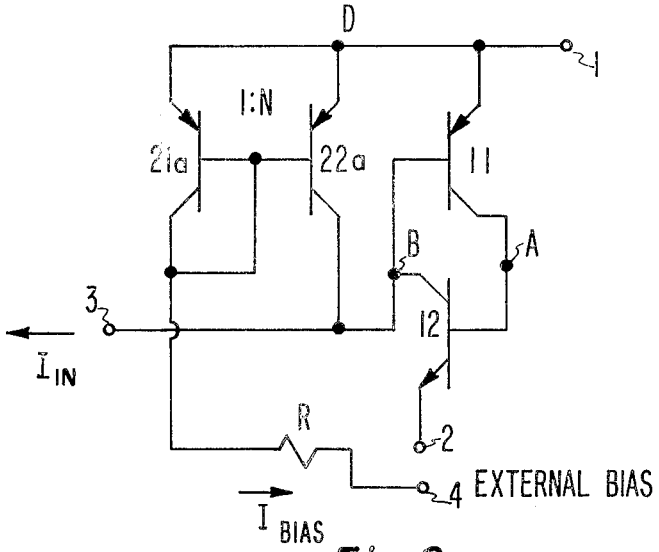
Figure 3A:
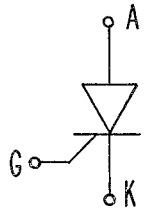
Figure 3B:
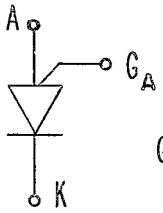
Figure 3C:
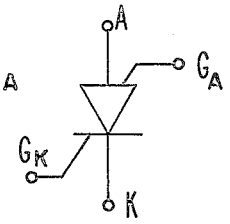
Figure 3D:
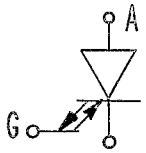
Figure 3E:
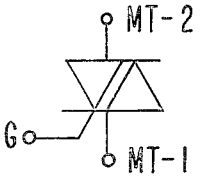

United States Defensive Publication

[19] (H) [11] T957,008

Sheng [43] Apr. 5, 1977

[54] SWITCHING CIRCUIT WITH ACCURATE CURRENT THRESHOLD

[75] Inventor: Abel Ching Nam Sheng, Morris Plains, N.J.

[73] Assignee: RCA Corporation

[21] Appl. No.: 676,195

[22] Filed: Apr. 12, 1976

[51] Int. Cl.[2] ..... H03K 17/72

[52] U.S. Cl. ..... 307/252 N; 307/359; 307/362; 307/252 J; 307/252 B

[57] ABSTRACT

A threshold current gate provides a diversion path for substantially all input current lower than a threshold value applied to the trigger electrode of a switch, such as a semiconductor controlled rectifier (SCR), thereby inhibiting switch triggering. When the input current exceeds the threshold value, that portion which exceeds the same flows into and triggers the switch.

16 Claims, 1 Sheet Drawing,

20 Pages Specification

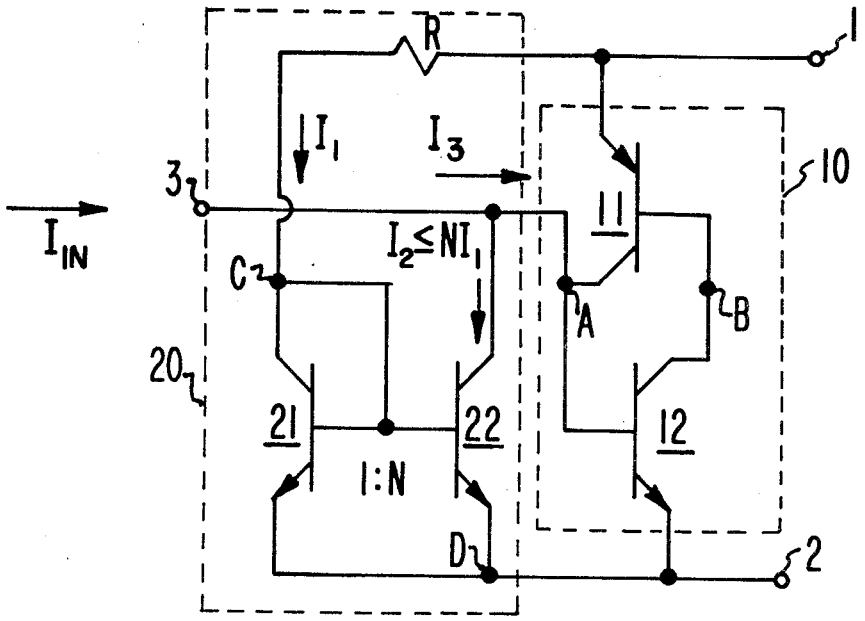

The file of this unexamined application may be inspected and copies thereof may be purchased (849 O.G. 1221, Apr. 9, 1968).